United States Patent
Huang et al.

(10) Patent No.: US 12,416,685 B2
(45) Date of Patent: Sep. 16, 2025

(54) FLEXIBLE PROBE FOR MicroLED DEFECT DETECTION AND MANUFACTURING METHOD THEREFOR

(71) Applicant: INSTITUTE OF FLEXIBLE ELECTRONICS TECHNOLOGY OF THU, ZHEJIANG, Jiaxing (CN)

(72) Inventors: Xian Huang, Jiaxing (CN); Qing Yang, Jiaxing (CN)

(73) Assignee: INSTITUTE OF FLEXIBLE ELECTRONICS TECHNOLOGY OF THU, ZHEJIANG, Jiaxing (CN)

( * ) Notice: Subject to any disclaimer, the term of this patent is extended or adjusted under 35 U.S.C. 154(b) by 210 days.

(21) Appl. No.: 18/262,059

(22) PCT Filed: Oct. 21, 2021

(86) PCT No.: PCT/CN2021/125154
§ 371 (c)(1),
(2) Date: Jul. 19, 2023

(87) PCT Pub. No.: WO2022/156285
PCT Pub. Date: Jul. 28, 2022

(65) Prior Publication Data
US 2024/0085493 A1    Mar. 14, 2024

(30) Foreign Application Priority Data

Jan. 19, 2021  (CN) .......................... 202110071396.9
Jan. 19, 2021  (CN) .......................... 202120158758.3

(51) Int. Cl.
*G01R 31/44*    (2020.01)
*G01R 1/067*    (2006.01)
(Continued)

(52) U.S. Cl.
CPC ......... *G01R 31/44* (2013.01); *G01R 1/06733* (2013.01); *G01R 1/071* (2013.01);
(Continued)

(58) Field of Classification Search
CPC .... G01R 31/44; G01R 31/28; G01R 31/2891; G01R 1/067; G01R 1/06733; G01R 1/07;
(Continued)

(56) References Cited

U.S. PATENT DOCUMENTS 5,629,630 A    5/1997  Thompson et al.
5,926,029 A    7/1999  Ference et al.
(Continued)

FOREIGN PATENT DOCUMENTS

CN    1745308 A      3/2006
CN    206387869 U    8/2017
(Continued)

OTHER PUBLICATIONS

Jang Tae Jin, Light Emitting Device and Method of Manufacturing the Same, Sep. 15, 2021, Machine Translation of KR-20210127522-A (Year: 2021).*
(Continued)

*Primary Examiner* — Lee E Rodak
*Assistant Examiner* — Jeremiah J Barron
(74) *Attorney, Agent, or Firm* — Osha Bergman Watanabe & Burton LLP (57) ABSTRACT

A flexible probe for microLED defect detection includes: a flexible base and a flexible circuit film layer. The flexible base includes a flexible substrate and flexible protrusions located on the flexible substrate. A circuit for illuminating a microLED to be detected is provided inside the flexible circuit film layer. The flexible circuit film layer is attached to a surface on a side of the flexible base on which the flexible protrusions are provided, at least a portion of the
(Continued)

circuit of the flexible circuit film layer is located on the flexible protrusions, and when the flexible probe for MicroLED defect detection is placed on the MicroLED, the circuit on the flexible protrusions abuts against pins of the MicroLED to be detected and is electrically connected to the pins.

18 Claims, 5 Drawing Sheets

(51) Int. Cl.
  *G01R 1/07* (2006.01)
  *G01R 1/073* (2006.01)
  *G01R 3/00* (2006.01)
  *G01R 31/28* (2006.01)

(52) U.S. Cl.
  CPC .............. *G01R 1/0735* (2013.01); *G01R 3/00* (2013.01); *G01R 31/2891* (2013.01)

(58) Field of Classification Search
  CPC ........ G01R 1/071; G01R 1/0735; G01R 3/00; G02F 1/13; H10H 29/14
  See application file for complete search history.

(56) References Cited

U.S. PATENT DOCUMENTS

| | | | |
|---|---|---|---|
| 2017/0170098 A1 | 6/2017 | Vreman et al. | |
| 2019/0304853 A1* | 10/2019 | Ahn | G01R 31/52 |
| 2020/0243712 A1* | 7/2020 | Fukaya | H10H 20/01 |
| 2021/0091281 A1* | 3/2021 | Lv | H01L 22/34 |
| 2021/0170472 A1* | 6/2021 | Lozano Bonet | B30B 15/065 |
| 2022/0216382 A1* | 7/2022 | Park | H10H 20/853 |
| 2023/0142259 A1* | 5/2023 | Liu | G09G 3/3233 |
| | | | 345/206 |

FOREIGN PATENT DOCUMENTS

| | | | | |
|---|---|---|---|---|
| CN | 109166877 A | | 1/2019 | |
| CN | 109377922 A | | 2/2019 | |
| CN | 110634840 A | | 12/2019 | |
| CN | 111969097 A | | 11/2020 | |
| KR | 20060051141 A | | 5/2006 | |
| KR | 20120010301 A | | 2/2012 | |
| KR | 20200079481 A | | 7/2020 | |
| KR | 20210127522 A | * | 10/2021 | ........... H10H 20/822 |

OTHER PUBLICATIONS

Office Action issued for Chinese patent application 202110071396.9, mailed Mar. 2, 2021 (17 pages).
International Search Report issued for corresponding international patent application No. PCT/CN2021/125154, mailed Jan. 19, 2022 (5 pages).
Written Opinion issued for corresponding international patent application No. PCT/CN2021/125154, mailed Jan. 19, 2022 (6 pages).
Office Action issued in Korean Application No. 10-2023-7025644, mailed on Jan. 2, 2025 (14 pages).

* cited by examiner

FLEXIBLE PROBE FOR MicroLED DEFECT DETECTION AND MANUFACTURING METHOD THEREFOR This application is a U.S. national phase of International Application No. PCT/CN2021/125154, filed on Oct. 21, 2021, which claims priority to Chinese Patent Applications No. 202110071396.9 and No. 202120158758.3, filed on Jan. 19, 2021, the entire contents of which are incorporated herein by reference.

TECHNICAL FIELD

The disclosure relates to the technical field of Micro light-emitting diode (MicroLED) defect detection, in particular to a flexible probe for MicroLED defect detection and a manufacturing method therefor.

BACKGROUND

MicroLED display technology is famous for its characteristics, such as, high brightness, high contrast, high luminous efficiency, low power consumption and less prone to aging phenomenon, and is currently the focus of research and development of new generation display technology. Although MicroLED display devices have many advantages, there are still problems such as high manufacturing costs and low yield rate in mass production of MicroLEDs, and one of the major difficulties is how to achieve high-precision defect detection of a large-area MicroLED.

Electroluminescence inspection technology is a common means of detection. In the related art, the electroluminescence inspection technology is to directly drive a MicroLED to illuminate through voltage, so as to obtain the working brightness, wavelength of the MicroLED and other information. Therefore, it is possible to find out the defective Light-Emitting Diode (LED) more intuitively and precisely. This method has a high accuracy. However, contact electroluminescence measurement has the potential to damage wafers. Meanwhile, the MicroLEDs are too small to implement electrical connection using traditional electrical test devices, mostly, the interconnection circuits of the MicroLED display device itself are used.

SUMMARY

The disclosure provides a flexible probe for MicroLED defect detection. The flexible probe for MicroLED defect detection includes: a flexible base and a flexible circuit film layer. The flexible base includes a flexible substrate and flexible protrusions located on the flexible substrate. The flexible circuit film layer is provided with a circuit for illuminating a MicroLED to be detected. The flexible circuit film layer is attached to a surface on a side of the flexible base on which the flexible protrusions are provided. At least a portion of the circuit of the flexible circuit film layer is located on the flexible protrusions. When the flexible probe for MicroLED defect detection is placed on the MicroLED, the circuit on the flexible protrusions abuts against pins of the MicroLED to be detected and is electrically connected to the pins.

The disclosure further provides a method for manufacturing a flexible probe for MicroLED defect detection. The method includes:

S1: providing a flexible base, in which the flexible base includes a flexible substrate and flexible protrusions provided on the flexible substrate, locations of the flexible protrusions correspond to locations of pins of a MicroLED to be detected, and providing a flexible circuit film layer, in which a circuit for illuminating the MicroLED to be detected is provided in the flexible circuit film layer; and S2: attaching the flexible circuit film layer to the flexible base, and configuring at least a portion of the circuit within the flexible circuit film layer to be located on the flexible protrusions.

DETAILED DESCRIPTION

In order to further elaborate the effects and technical means adopted by the disclosure to achieve the intended purposes of the disclosure, in the following, a detailed description is made with reference to the accompanying drawings and preferred embodiments.

The contact electroluminescence inspection technology can be used as a means of quality control after the completion of MicroLED interconnection, and it is very difficult to perform electroluminescence inspection before realizing the electrical connection of the MicroLEDs.

In view of this, the disclosure provides a flexible probe for MicroLED defect detection and a manufacturing method therefor, the flexible probe for MicroLED defect detection can detect the MicroLED before realizing the electrical connection of the MicroLEDs.

The disclosure provides a flexible probe for MicroLED defect detection and a manufacturing method therefor. The flexible probe for MicroLED defect detection enables to perform the detection of MicroLED before the MicroLED's electrical connection process is completed.

Figure 1:
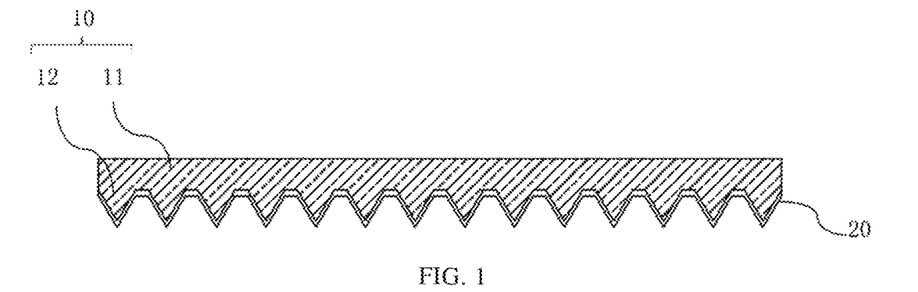
FIG. 1 is a schematic sectional view of a flexible probe for MicroLED defect detection provided in a first embodiment of the disclosure.
Figure 2:
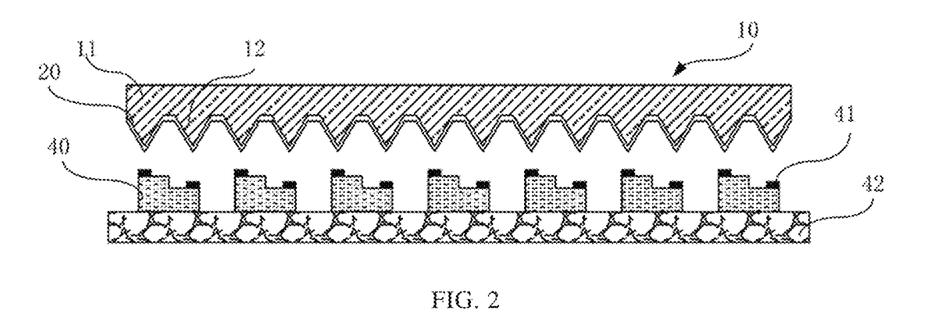
FIG. 2 is a schematic diagram of the flexible probe for MicroLED defect detection in FIG. 1 when performing MicroLED defect detection.
Figure 3:
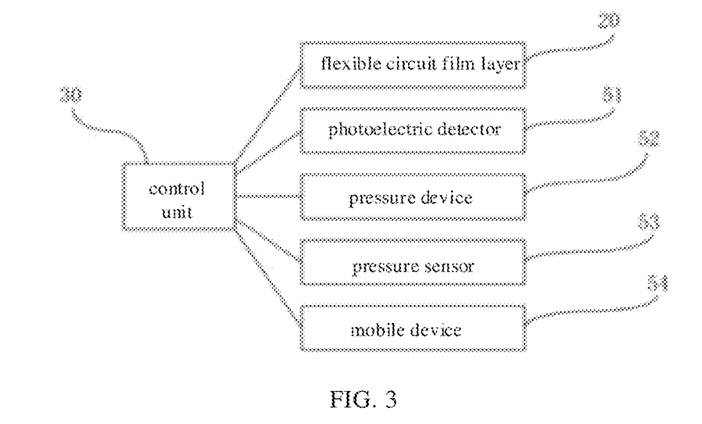
FIG. 3 is a block diagram of a flexible probe for MicroLED defect detection.

FIG. 1 is a schematic sectional view of a flexible probe for MicroLED defect detection provided in a first embodiment of the disclosure. FIG. 2 is a schematic diagram of the flexible probe for MicroLED defect detection in FIG. 1 when performing MicroLED defect detection. FIG. 3 is a block diagram of a flexible probe for MicroLED defect detection. As shown in FIGS. 1 to 3, the flexible probe for MicroLED defect detection provided in the first embodiment of the disclosure includes: a flexible base 10 and a flexible circuit film layer 20. The flexible base 10 includes a flexible substrate 11 and flexible protrusions 12 located on the flexible substrate 11. The flexible circuit film layer 20 is provided with a circuit for illuminating the MicroLED to be detected. The flexible circuit film layer 20 is attached to a surface on a side of the flexible base 10, the side is a side on which the flexible protrusions 12 are provided. At least a portion of the circuit of the flexible circuit film layer 20 is located on the flexible protrusions 12. When the flexible probe for MicroLED defect detection is placed on the MicroLED 40, the circuit on the flexible protrusions 12 abuts against pins 41 of the MicroLED 40 and is electrically connected to the pins 41.

In an embodiment, the MicroLED 40 can be illuminated by the flexible circuit film layer 20. After the MicroLED to be detected is illuminated, electrical parameters of the MicroLED 40 can be collected and analyzed, and then the quality of the MicroLED can be evaluated.

The flexible probe for MicroLED defect detection further includes a control unit 30. The control unit 30 is electrically connected to the flexible circuit film layer 20, and the control unit 30 controls the flexible circuit film layer 20 to illuminate the MicroLED 40.

In an embodiment, by forming the flexible protrusions 12 on the flexible base 10 and providing the flexible circuit film layer 20 on the side of the flexible base 10 where the flexible protrusions 12 are located, every two flexible protrusions 12 are connected to two pins 41 of one MicroLED 40 during detection. Due to the flexibility of the flexible protrusions 12, when placing the flexible probe on the MicroLEDs 40 arranged in an array, the flexible protrusions 12 are under more pressure at the higher pins 41 of the MicroLED 40 and are deformed significantly, while the flexible protrusions 12 are under less pressure and are slightly deformed at the lower pins 41 of the MicroLED. Based on deformations of the flexible protrusions 12 at different parts, all the flexible circuit film layer 20 on the flexible protrusions 12 can be in contact with the pins 41 of the MicroLED 40, and the MicroLED 40 can be illuminated by the external flexible circuit film layer 20. After the MicroLED 40 is illuminated, the electrical parameters of the illuminated MicroLED 40, such as current and voltage, can be detected to complete the electroluminescence detection of the MicroLED 40.

In an embodiment, the height difference of the MicroLED 40 is compensated by the flexibility of the external flexible base 10, and the MicroLED 40 is illuminated by the external flexible circuit film layer 20. Therefore, the circuit layout is not required for the MicroLED when the probe is used for detection. In a production process, a large number of MicroLEDs can be detected directly while the MicroLEDs are still on a wafer 42, which makes the detection process convenient and simple.

In order to facilitate direct detection of the MicroLED 40, a circuit for collecting the electrical parameters of the MicroLED 40 to be detected after the MicroLED 40 is illuminated, is further provided in the flexible circuit film layer. After the MicroLED 40 to be detected is illuminated, the control unit 30 collects the electrical parameters of the MicroLED 40 to be detected, so that the MicroLED 40 can be detected according to the electrical parameters. In an embodiment, the electrical parameters may be current.

The flexible protrusions 12 are arranged in an array on the flexible substrate 11, and are adapted to locations of the pins in the MicroLED to be detected.

After the detection, the control unit 30 outputs a Known Good Die (KGD) file containing a location of at least one qualified MicroLED 40 based on a detection result. In a subsequent manufacture process of the MicroLED 40, only the qualified MicroLED 40 can be selectively released on the wafer based on this file, thereby reducing production costs and simplifying the production process.

Figure 4:
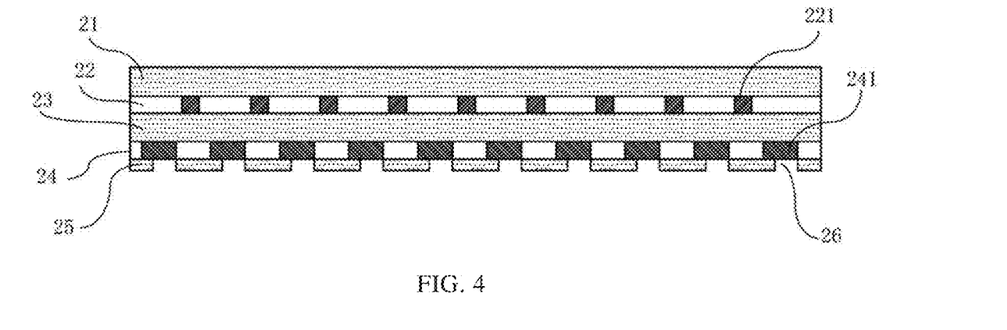
FIG. 4 is a schematic sectional view in a first direction of a flexible detection electrode film layer.
Figure 5:
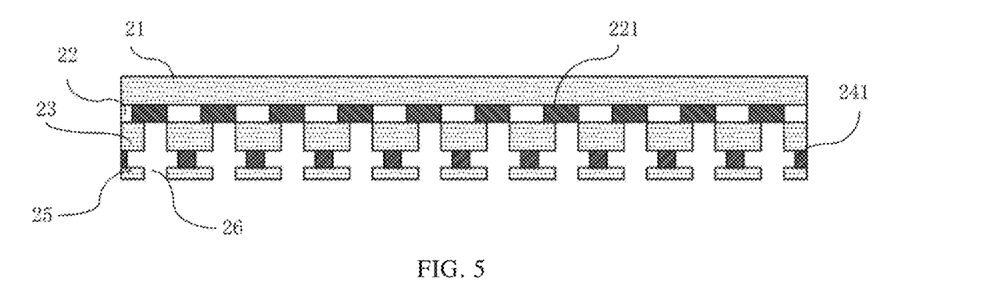
FIG. 5 is a schematic sectional view in a second direction of a flexible detection electrode film layer.
Figure 6:
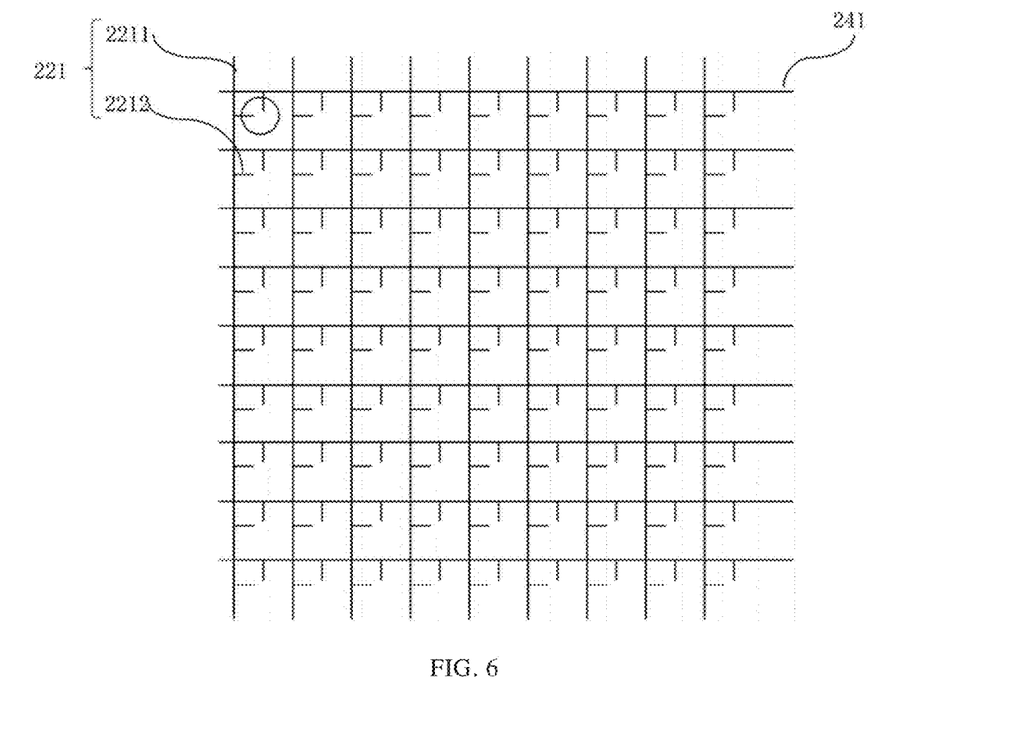
FIG. 6 is a schematic diagram of a relation between a location of a first electrode layer and a location of a second electrode layer.

FIG. 4 is schematic sectional view in a first direction of a flexible electrode film layer. FIG. 5 is schematic sectional view in a second direction of a flexible electrode film layer. FIG. 6 is a schematic diagram of a relation between a location of a first electrode layer and a location of a second electrode layer. In FIGS. 4 and 5, the first direction is an extension direction of a first electrode wire 221, and the second direction is an extension direction of a second electrode wire 241 in the following texts. In FIGS. 4 to 6, in an embodiment, the flexible circuit film layer 20 includes a first encapsulation layer 21, a first electrode layer 22, an insulation layer 23, a second electrode layer 24 and a second encapsulation layer 25. The first encapsulation layer 21, the first electrode layer 22, the insulation layer 23, the second electrode layer 24 and the second encapsulation layer 25 are provided layer by layer. That is, the insulation layer 23 is provided between the first electrode layer 22 and the second electrode layer 24, the first electrode layer 22 is provided between the first encapsulation layer 21 and the insulation layer 23, and the second electrode layer 24 is provided between the second encapsulation layer 25 and the insulation layer 23. The first encapsulation layer 21 is provided on a side of the flexible circuit film layer 20 facing the flexible protrusions 12. As shown in FIG. 4, the second encapsulation layer 25 is provided with through holes 26 exposing the second electrode layer 24. As shown in FIG. 5, the second electrode layer 24, the second encapsulation layer 25 and the insulation layer 23 are formed with through holes 26 exposing the first electrode layer 22. Locations of the through holes 26 correspond to locations of the flexible protrusions 12. On two flexible protrusions 12 connected to the pins 41 on the MicroLED 40, the first electrode layer 22 is exposed through the through holes 26 at the top of one of the two flexible protrusions 12, and the second electrode layer 24 is exposed through the through holes 26 at the top of the other one of the two flexible protrusions 12. That is, the circuit in the above flexible circuit film layer 20 is provided within the first electrode layer 22 and the second electrode layer 24.

As shown in FIG. 6, in an in embodiment, the first electrode layer 22 includes a plurality of first electrode wires 221 extending along the first direction shown in FIG. 4, and the second electrode layer 24 includes a plurality of second electrode wires 241 extending along the second direction shown in FIG. 5. It is to be explained that for display purposes, FIG. 6 only shows a relation between locations of the first electrode wires 221 and locations of the second electrode wires 241, and omits the first encapsulation layer 21, the insulation layer 23 and the second encapsulation layer 25.

In an embodiment, an array of electrodes is formed within the flexible circuit film layer 20 by the arrangement of the plurality of first electrode wires 221 and the plurality of the second electrode wires 241 The control unit 30 can use a passive matrix driving method to illuminate the MicroLEDs 40 arranged in an array.

In an embodiment, when a particular first electrode wire 221 and a particular second electrode wire 241 are selected for powering, a MicroLED 40 connected to both the first electrode wire 221 and the second electrode wire 241 may be illuminated, so as to detect the MicroLED 40. This approach enables a fast detection of an array of MicroLEDs 40 in a multi-unit parallel measurement manner.

Figure 7:
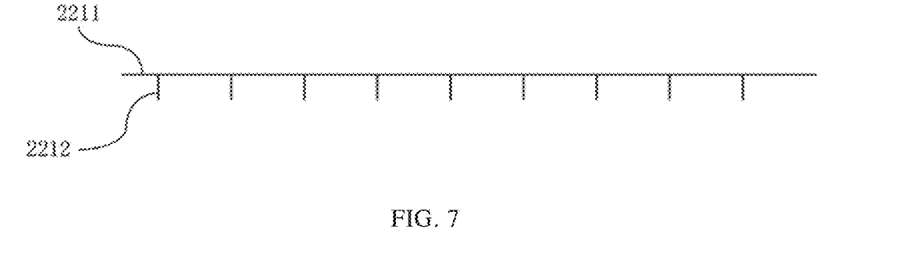
FIG. 7 is a schematic diagram of a first electrode wire.

FIG. 7 is a schematic diagram of a first electrode wire. As illustrated in FIG. 6 and FIG. 7, in an embodiment, both the first electrode wire 221 and the second electrode wire 241 include a base line 2211 and a plurality of spaced extension lines 2212 provided on the base line 2211. An angle is formed between an extension line 2212 and the base line 2211. Each of the extension lines 2212 on the first electrode wire 221 and a corresponding extension line 2212 on the second electrode wire form a connection unit (a structure as indicated in the circle in FIG. 6) corresponding to one MicroLED 40. The connection unit is configured to connect to two pins 41 on the MicroLED 40. In an embodiment, the first electrode wire 221 and the second electrode wire 241 are interleaved, e.g., 90° interleaved.

That is, at this point, an extension line 2212 on the first electrode wire 221 is connected to one pin 41 of the MicroLED 40 by passing through the through holes 26 on the insulation layer 23, the second electrode layer 24 and the second encapsulation layer 25 successively, while an extension line 2212 on the second electrode wire 241 is connected to the other pin 41 of the MicroLED 40 by passing through the through holes 26 on the second encapsulation layer 25. It should be noted that FIG. 6 only shows the structure of the first electrode wire 221, while the structure of the second electrode wire 241 can be the same as the structure of the first electrode wire 221, which is not shown separately here.

In an embodiment, the base lines 2211 of the first electrode wire 221 and the second electrode wire 241 can be arranged between the flexible protrusions 12. The extension lines 2212 on the first electrode wire 221 and the second electrode wire 241 are arranged on the corresponding flexible protrusions 12. By the above settings, the first electrode layer 22 and the second electrode layer 24 can be easily deformed, and it is easier for the flexible circuit film layer 20 to attach to the flexible protrusions 12 on the base.

In an embodiment, from a direction close to the insulation layer 23 to a direction far from the insulation layer 23, the first electrode wire 221 and the second electrode wire 241 include a Ti (titanium) metal layer, a Cu (copper) metal layer, a Ti metal layer and an Au (gold) metal layer successively. By setting the Ti metal layers, the steadiness of the connection between the Cu metal layer and the Au metal layer, and the steadiness of the connection between the Cu metal layer and the insulation layer 23 can be guaranteed.

It is understood that, in other embodiments, the first electrode wire 221 and the second electrode wire 241 may be single metallic wires, such as a nano-silver wire, a nano-copper wire, etc.

As shown in FIG. 1 and FIG. 3, in an embodiment, the flexible probe for MicroLED defect detection also includes a photoelectric detector 51, such as a surface array Complementary Metal Oxide Semiconductor (CMOS) photoelectric detector 51. The photoelectric detector 51 is electrically connected to the control unit 30. The photoelectric detector 51 detects the lights emitted by the MicroLED 40 and transmits a detection result to the control unit 30. The control unit 30 can determines quality of the MicroLED 40 based on the information to assist the detection of electrical parameters, such as current.

In an embodiment, the flexible base 10 can be a transparent flexible base 10. The photoelectric detector 51 is arranged on a side of the flexible substrate 11 away from the flexible protrusions 12, and the lights emitted by the MicroLED 40 shines through the flexible substrate 11 into the photoelectric detector 51, so that the photoelectric detector 51 can detect the lights.

The flexible probe for MicroLED defect detection further includes: a pressure device 52. The pressure device 52 may apply pressure to the flexible base 10, to make the connection between the flexible circuit film layer 20 on the flexible base 10 and the MicroLED 40. A pressure sensor 53, such as a piezoresistive or capacitive thin film pressure sensor 53, may also be provided on the flexible probe for MicroLED defect detection, e.g., on a side of the photoelectric detector 51 away from the flexible substrate 11, to measure a pressure applied to the flexible probe. The pressure sensor 53 is electrically connected to the control unit 30. The pressure sensor 53 transmits the detected pressure information to the control unit 30. The control unit 30 performs pressure compensation on the detection results of the electrical parameters and the lights, etc., based on the pressure information transmitted by the pressure sensor 53.

The difference in the manufacturing of the flexible protrusions 12 on the flexible substrate 11 and the pressure distribution condition may affect a contact condition between the flexible circuit film layer 20 and the pins 41 of the MicroLED 40 and the resistance at the contact points, which in turn affects the uniformity of the measurement data. Therefore, by the setting of the pressure sensor 53, it can compensate for the detection of electrical parameters and light, to accurately determine the quality of the MicroLED 40.

The flexible probe for MicroLED defect detection also includes a mobile device 54 for moving the flexible substrate 11, to facilitate detection of the MicroLED 40s on the wafer 42 by region.

Figure 8:
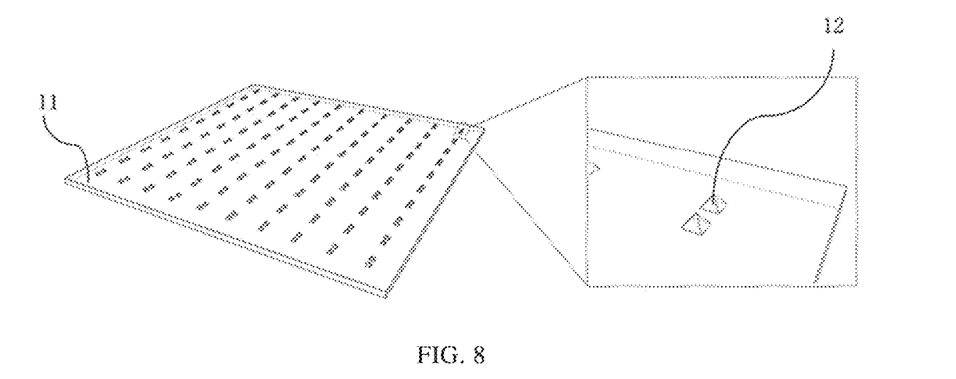
FIG. 8 is a schematic diagram of a flexible base.
Figure 11:
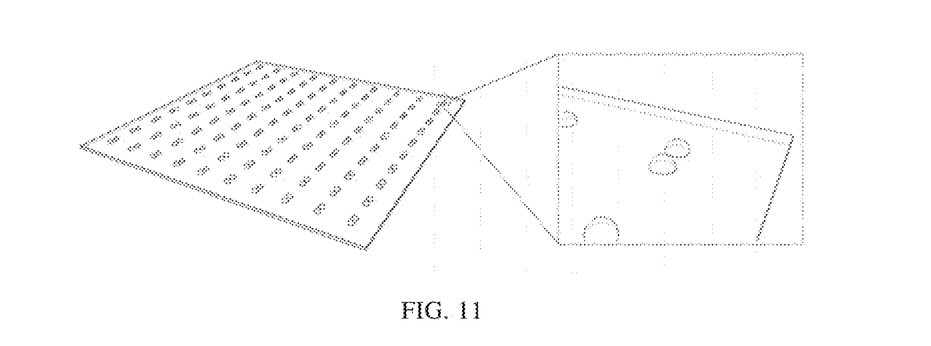
FIG. 11 is a schematic diagram of a flexible base in a third embodiment of the disclosure.
Figure 12:
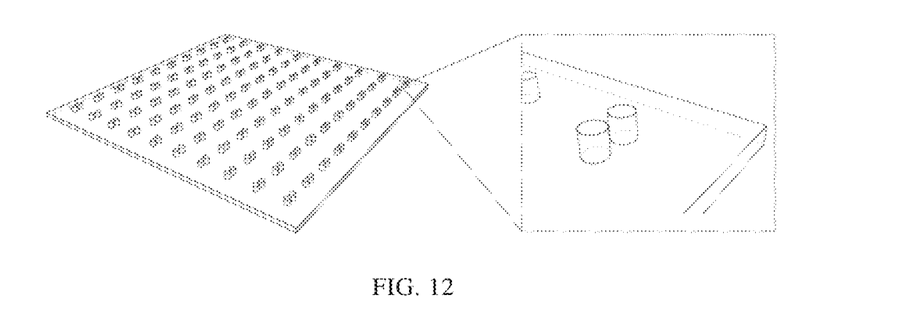
FIG. 12 is a schematic diagram of a flexible base in a fourth embodiment of the disclosure.

FIG. 8 is a schematic diagram of a flexible base. As shown in FIG. 8, in an embodiment, the flexible protrusions 12 may be pyramidal (as shown in FIG. 8), hemispherical (as shown in FIG. 11) or cylindrical (as shown in FIG. 12) in shape. These three different shapes can be adapted to different needs. For example, the pyramid shape can make the extensions on the first electrode wires 221 and the second electrode wires 241 have a sufficiently large wiring area. The hemispherical shape is conducive to ensuring the uniform deformation of the flexible protrusions 12 after the flexible probe is pressed. The cylindrical shape enables the base lines 2211 of the first electrode wires 221 and the second electrode wires 241 to be laid out more easily. It needs to be noted that the flexible protrusions 12 can also be other geometric shapes, which is not limited.

In an embodiment, the flexible base 10 can be a flexible base 10 made of polydimethylsiloxane (PDMS), Ecoflex material or other materials. The first encapsulation layer 21, the insulation layer 23 and the second encapsulation layer 25 can be the first encapsulation layer 21, the insulation layer 23 and the second encapsulation layer 25 made of polyimide, poly-p-xylene, etc.

In order to facilitate the connection between the first encapsulation layer 21 and the flexible substrate 11, a SiO2 layer and a Ti layer are also provided successively between the flexible substrate 11 and the first encapsulation layer 21 in a direction from the direction close to the flexible substrate 11 to the direction away from the flexible substrate 11.

In conclusion, the disclosure compensates for the height difference of the MicroLED 40 through the external flexible base 10 and illuminates the MicroLED 40 through the external flexible circuit film layer 20. Therefore, when using the probe for detection, there is no need to perform wiring layout for the MicroLED. In the production process, the MicroLED can be detected directly while the MicroLED 40 is still on the wafer 42, which makes the detection process more convenient and simple.

Figure 9:
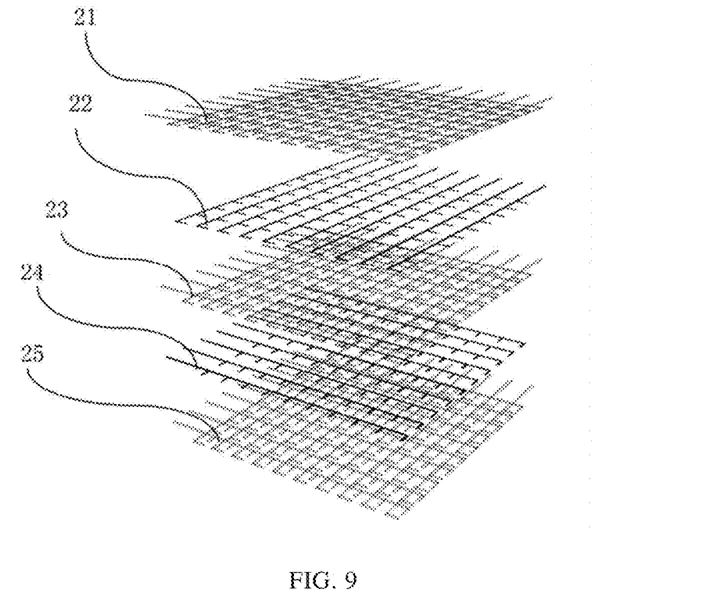
FIG. 9 is a schematic diagram of a decomposed structure of a flexible electrode film layer in a second embodiment of the disclosure.
Figure 10:
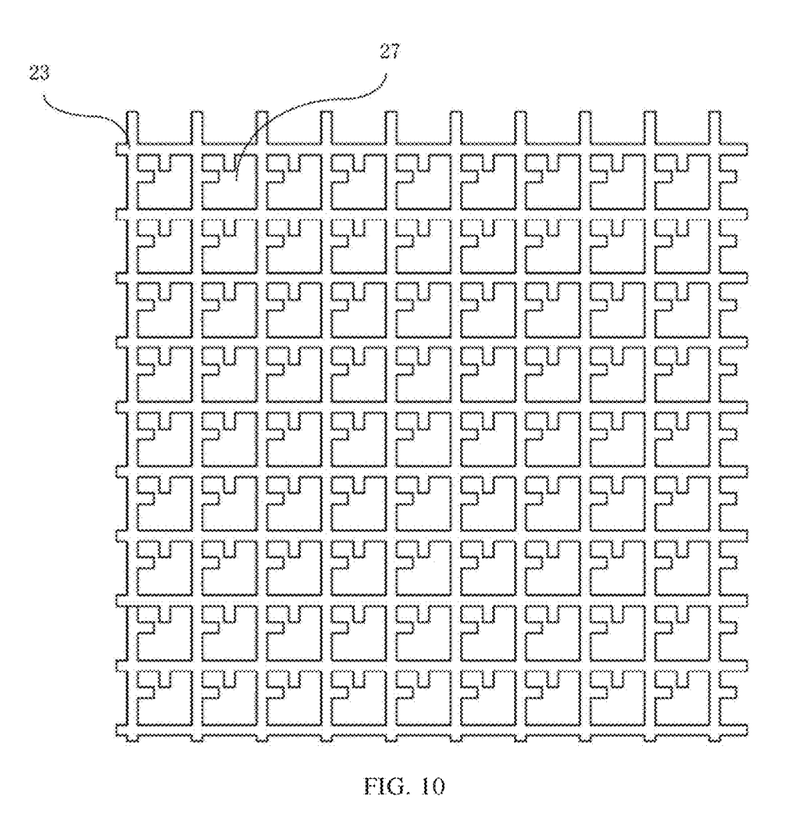
FIG. 10 is a schematic diagram of an insulation layer in FIG. 9.

FIG. 9 is a schematic diagram of a decomposed structure of a flexible electrode film layer in a second embodiment of the disclosure. FIG. 10 is a schematic diagram of an insulation layer in FIG. 9. As shown in FIG. 9 and FIG. 10, the flexible probe for MicroLED defect detection provided in the second embodiment of the disclosure is basically the same as that in the first embodiment, except that hollow regions 27 are formed in regions other than the first electrode wires 221 on the first encapsulation layer 21, in regions other than the first electrode wires 221 and the second electrode wires 241 on the insulation layer 23, and/or in regions other than the second electrode wire 241 on the second encapsulation layer 25. That is, the first encapsulation layer 21, the second encapsulation layer 25 and the insulation layer 23 are in the shape of a mesh. Taking the insulation layer 23 in FIG. 10 as an example, similar as a pattern of a combination of the first electrode wires 221 and the second electrode wires 241, the insulation layer 23 is in a mesh shape. The first electrode wires 221 and the second electrode wires 241 are provided on the grid lines of the meshed insulation layer 23 on the upper and lower sides of the insulation layer 23 respectively. Similarly, the first electrode wires 221 correspond to the grid lines of the meshed first encapsulation layer 21, and the second electrode wires 241 correspond to the grid lines of the second encapsulation layer 25.

By the settings of the hollow regions 27, the regions where the extensions of the first electrode wires 221 and the second electrode wires 241 are located can be warped up under the action of the flexible protrusions 12, which can better attach the flexible circuit film layer 20 to the flexible substrate 11, so that the extension lines 2212 of the first electrode wires 221 and the second electrode wires 241 are fixed on the top of the flexible protrusions 12.

It should be noted that, the first electrode wires 221 need to contact to the pins 41 of the MicorLED 40 by crossing the insulation layer 23. Therefore, in an embodiment, the hollow part contains through holes 26, provided on the insulation layer 23, for making the extension lines 2212 of the first electrode wires 221 contact with the pins 41 of the MicroLED 40.

The disclosure further provides a method for manufacturing a flexible probe for MicroLED defect detection. The method includes following steps:

S1: a flexible base 10 is provided. The flexible base 10 includes a flexible substrate 11 and flexible protrusions 12 provided on the flexible substrate 11. Locations of the flexible protrusions 12 correspond to locations of pins 41 of a MicroLED 40 to be detected. A flexible circuit film layer 20 is provided. A circuit for illuminating the MicroLED 40 is provided in the flexible circuit film layer 20.

In an embodiment, when preparing the flexible base 10, a mold can be provided first, and then the flexible base 10 can be prepared by performing a spin coating technique on the mold using a spin coater.

When preparing the flexible circuit film layer 20, the flexible circuit film layer 20 can be prepared through techniques such as photolithography, sputtering, oxygen plasma etching, etc., so that the flexible circuit film layer 20 successively includes the first encapsulation layer 21, the first electrode layer 22, the insulation layer 23, the second electrode layer 24 and the second encapsulation layer 25.

S2: the flexible circuit film layer 20 is attached to the flexible base 10, and at least a portion of the circuit within the flexible circuit film layer 20 is configured to be located on the flexible protrusions 12.

In an embodiment, the flexible base 10 can be a flexible base 10 made of PDMS, Ecoflex material, or other materials. During attaching, the method includes the following steps:

On a side of the flexible circuit film layer 20 attached to the flexible base 10, a Ti metal layer and a SiO2 layer are successively formed through techniques such as electron beam evaporation and deposition, etc.

A water-soluble tape is used to transfer and print the flexible circuit film layer 20 onto the flexible base 10, and alignment is performed, so that the circuit within the flexible circuit film layer 20 is located on the flexible protrusions 12. Then the water-soluble tape is removed.

The $SiO_2$ layer is bonded with the flexible base 10 by a bonding technique such as ultraviolet ozone treatment, to realize permanent binding between the flexible circuit film layer 20 and the flexible base 10.

In an embodiment, the template can made of silicon material. When making the template, different production methods can be adopted depending on the shape of the flexible protrusions 12.

For example, when the flexible protrusions 12 are in a pyramid shape, the flexible protrusions 12 can be manufactured through a silicon alkaline wet etching technique. Various anisotropic etchings are produced due to crystalline phase problems in the silicon alkaline wet etching. The atomic density of 111 crystalline phase is greater than that of 110 crystalline phase, and it is also greater than that of 100 crystalline phase, and the etching speed of the 100 crystalline phase is about 100 times that of the 111 crystalline phase. The reaction time periods and etching hole sizes of anisotropic silicon etchings are regulated, to achieve the regulation from the platform to the top of the pyramid top morphology, so as to facilitate the regulation of contact areas of the flexible protrusions 12 with the pins of the MicroLED when the manufacturing of the flexible base 10 is completed. A 100-crystalline phase silicon wafer is used, a photolithography technique is used to expose square patterns corresponding to the pins of the MicroLED, to protect the rest of the wafer. Potassium hydroxide or tetramethylammonium hydroxide is used to perform the silicon wet etching, and heating is performed, to obtain a pyramid microstructure template. Silicone is used for spin coating, and 120° C. heating is used for demoulding, to obtain the flexible base 10 having the pyramid shaped flexible protrusions 12.

When the flexible protrusions 12 are hemispherical in shape, silicon acid wet etching is used for preparation. Firstly the photolithography technique is used to make the silicon wafer expose circular patterns corresponding to the pins of the MicroLED, and protect the rest parts. The silicon wet etching is performed using nitric acid and hydrofluoric acid. Firstly, the silicon is oxidized to silicon dioxide by the nitric acid, and then the silicon dioxide reacts with the hydrofluoric acid to generate fluorosilicic acid, thus obtaining a template with a hemispherical microstructure. The flexible base 10 having the hemispherical flexible protrusions 12 is obtained by using silicone for spin coating and using 120° C. heating for demoulding.

When the flexible protrusions 12 is cylindrical in shape, it is prepared by dry etching using a deep silicon etching technique. Passivation gas and etching gas are induced into a plasma etching machine. The passivation gas is decomposed under the action of plasma to form a protection layer. The protection layer on the sidewall will not be removed due to the directional nature of plasma etching and low etching speed. Firstly the photolithography technique is used to expose circular patterns corresponding to the pins of the MicroLED, and protect the rest parts. The passivation step and the etching step are repeated, which make the etching is performed in the vertical direction continuously, to obtain a template with a cylindrical microstructure. The flexible base 10 having the cylindrical flexible protrusions 12 is obtained by using silicone for spin coating and using 120° C. heating for demoulding.

In the disclosure, the external flexible base is used for making up for the height difference of the MicroLED, and the external flexible circuit film layer is used to detect the MicroLED, so that circuit layout is not required for the MicroLED when the probe is used for detection. In a production process, the MicroLED can be detected directly while the MicroLED is still on the wafer, which makes the detection process convenient and simple.

The above are only preferred embodiments of the disclosure and are not intended to limit the disclosure in any form. Although this disclosure has been disclosed as above with the preferred embodiments, the preferred embodiments are not used to limit this disclosure, those skilled in the art can make some changes or modifications to the above revealed technical contents to obtain equivalent embodiments of equivalent changes, without departing from the scope of the technical solution of this disclosure. However, any simple modification, equivalent changes and modifications of the above embodiments according to the technical substance of this disclosure without departing from the contents of the technical solution of this disclosure are still within the scope of the technical solution of this disclosure.

What is claimed is:

1. A flexible probe for Micro light-emitting diode (MicroLED) defect detection, comprising: a flexible base and a flexible circuit film layer, wherein the flexible base comprises a flexible substrate and flexible protrusions located on the flexible substrate, the flexible circuit film layer is provided with a circuit for illuminating a MicroLED to be detected, the flexible circuit film layer is attached to a surface on a side of the flexible base on which the flexible protrusions are provided, at least a portion of the circuit of the flexible circuit film layer is located on the flexible protrusions, and when the flexible probe for MicroLED defect detection is placed on the MicroLED, the circuit on the flexible protrusions abuts against pins of the MicroLED to be detected and is electrically connected to the pins, wherein the flexible circuit film layer comprises a first encapsulation layer, a first electrode layer, an insulation layer, a second electrode layer and a second encapsulation layer; the first encapsulation layer, the first electrode layer, the insulation layer, the second electrode layer and the second encapsulation layer are arranged successively from a side where the flexible base is located to a direction away from the flexible base; the second encapsulation layer is provided with through holes exposing the second electrode layer; the second electrode layer, the second encapsulation layer and the insulation layer are formed with through holes exposing the first electrode layer; locations of the through holes correspond to locations of the flexible protrusions; and the circuit within the flexible circuit film layer is provided within the first electrode layer and the second electrode layer.

2. The flexible probe for MicroLED defect detection of claim 1, further comprising a control unit, wherein the control unit is electrically connected to the flexible circuit film layer, and the control unit controls the flexible circuit film layer to illuminate the MicroLED to be detected.

3. The flexible probe for MicroLED defect detection of claim 2, wherein a circuit for collecting an electrical parameter of the MicroLED to be detected is provided within the flexible circuit film layer, the control unit collects the electrical parameter of the MicroLED to be detected after the MicroLED to be detected is illuminated.

4. The flexible probe for MicroLED defect detection of claim 3, wherein the control unit detects the MicroLED to be detected based on the electrical parameter and outputs a Known Good Die (KGD) file containing a location of at least one qualified MicroLED.

5. The flexible probe for MicroLED defect detection of claim 2, further comprising a photoelectric detector, wherein the photoelectric detector is electrically connected to the control unit, the photoelectric detector detects a light emitted by the MicroLED to be detected and transmits a detection result to the control unit, and the control unit determines a quality of the MicroLED to be detected based on light information.

6. The flexible probe for MicroLED defect detection of claim 5, wherein the flexible base is a transparent flexible base, and the photoelectric detector is arranged on a side of the flexible substrate away from the flexible protrusions.

7. The flexible probe for MicroLED defect detection of claim 5, further comprising: a pressure device for applying pressure to the flexible base, and a pressure sensor for detecting an applied pressure, wherein the pressure device and the pressure sensor are electrically connected to the control unit, and the control unit performs pressure compensation on a detection result based on the pressure detected by the pressure sensor.

8. The flexible probe for MicroLED defect detection of claim 1, wherein the flexible protrusions are arranged in an array on the flexible substrate and are adapted to locations of the pins of the MicroLED to be detected.

9. The flexible probe for MicroLED defect detection of claim 1, wherein the first electrode layer comprises a plurality of first electrode wires, the second electrode layer comprises a plurality of second electrode wires, each of the first electrode wire and the second electrode wire comprises a base line and a plurality of spaced extension lines arranged on the base line, each of the extension lines on the first electrode wire and a corresponding extension line on the second electrode wire form a connection unit corresponding to the MicroLED to be detected, the connection unit is configured to connect to two pins of the microLED to be detected, the base lines on the first electrode wires and the second electrode wires are arranged between the flexible protrusions, and the extension lines on the first electrode wires and the second electrode wires are arranged on the corresponding flexible protrusions.

10. The flexible probe for MicroLED defect detection of claim 9, wherein the first electrode wires extend in a first direction, the second electrode wires extend in a second direction, and the first electrode wires are interlaced with the second electrode wires.

11. The flexible probe for MicroLED defect detection of claim 9, wherein a hollow region is formed in at least one of:
a region other than the first electrode wires on the first encapsulation layer;
a region other than the first electrode wires and the second electrode wires on the insulation layer; or
a region other than the second electrode wires on the second encapsulation layer.

12. The flexible probe for MicroLED defect detection of claim 11, wherein the first encapsulation layer, the second encapsulation layer and the insulation layer are in a mesh shape, locations of the first electrode wires correspond to locations of grid lines of the first encapsulation layer in the mesh shape, the locations of the first electrode wires and locations of the second electrode wires correspond to locations of grid lines of the insulation layer in the mesh shape, and the locations of the second electrode wires correspond to locations of grid lines of the second encapsulation layer in the mesh shape.

13. The flexible probe for MicroLED defect detection of claim 1, wherein the flexible protrusions are pyramidal, hemispherical or cylindrical in shape.

14. A method for manufacturing a flexible probe for MicroLED defect detection, comprising:
- S1: providing a flexible base, wherein the flexible base comprises a flexible substrate and flexible protrusions provided on the flexible substrate, locations of the flexible protrusions correspond to locations of pins of a MicroLED to be detected, and providing a flexible circuit film layer, wherein a circuit for illuminating the MicroLED to be detected is provided in the flexible circuit film layer; and
- S2: attaching the flexible circuit film layer to the flexible base, and configuring at least a portion of the circuit within the flexible circuit film layer to be located on the flexible protrusions,
- wherein the flexible circuit film layer comprises a first encapsulation layer, a first electrode layer, an insulation layer, a second electrode layer and a second encapsulation layer; the first encapsulation layer, the first electrode layer, the insulation layer, the second electrode layer and the second encapsulation layer are arranged successively from a side where the flexible base is located to a direction away from the flexible base; the second encapsulation layer is provided with through holes exposing the second electrode layer; the second electrode layer, the second encapsulation layer and the insulation layer are formed with through holes exposing the first electrode layer; locations of the through holes correspond to locations of the flexible protrusions; and the circuit within the flexible circuit film layer is provided within the first electrode layer and the second electrode layer.

15. The method for manufacturing a flexible probe for MicroLED defect detection of claim 14, wherein the flexible base is made of Polydimethylsiloxane (PDMS) or Ecoflex material, and when performing S2, the method comprises:
- forming a Ti metal layer and a $SiO_2$ layer successively on a side of the flexible circuit film layer attached to the flexible base;
- aligning the flexible circuit film layer with the flexible base, to make the circuit within the flexible circuit film layer located on the flexible protrusions; and
- bonding the $SiO_2$ layer with the flexible base by a bonding technique.

16. The method for manufacturing a flexible probe for MicroLED defect detection of claim 14, wherein the first electrode layer comprises a plurality of first electrode wires, the second electrode layer comprises a plurality of second electrode wires, each of the first electrode wire and the second electrode wire comprises a base line and a plurality of spaced extension lines arranged on the base line, each of the extension lines on the first electrode wire and a corresponding extension line on the second electrode wire form a connection unit corresponding to the MicroLED to be detected, the connection unit is configured to connect to two pins of the microLED to be detected, the base lines on the first electrode wires and the second electrode wires are arranged between the flexible protrusions, and the extension lines on the first electrode wires and the second electrode wires are arranged on the corresponding flexible protrusions.

17. The method for manufacturing a flexible probe for MicroLED defect detection of claim 16, wherein the first electrode wires extend in a first direction, the second electrode wires extend in a second direction, and the first electrode wires are interlaced with the second electrode wires.

18. The method for manufacturing a flexible probe for MicroLED defect detection of claim 16, a hollow region is formed in at least one of:
- a region other than the first electrode wires on the first encapsulation layer;
- a region other than the first electrode wires and the second electrode wires on the insulation layer; or
- a region other than the second electrode wires on the second encapsulation layer.

* * * * *